United States Patent
Henry et al.

(10) Patent No.: US 7,549,917 B2
(45) Date of Patent: Jun. 23, 2009

(54) METHODS FOR DISTRIBUTING AIR IN A BLADE SERVER

(75) Inventors: Matthew S. Henry, Raleigh, NC (US); David J. Jensen, Raleigh, NC (US); Seth D. Lewis, Cary, NC (US); Peter A. Smith, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/014,911

(22) Filed: Jan. 16, 2008

(65) Prior Publication Data

US 2008/0160899 A1   Jul. 3, 2008

Related U.S. Application Data

(63) Continuation of application No. 11/368,578, filed on Mar. 6, 2006, now Pat. No. 7,344,439.

(51) Int. Cl.
*H05K 7/20* (2006.01)
*H05K 5/00* (2006.01)
*G06F 1/20* (2006.01)

(52) U.S. Cl. .................. 454/184; 361/687; 361/695

(58) Field of Classification Search ............. 454/184; 361/687, 695
See application file for complete search history.

(56) References Cited

U.S. PATENT DOCUMENTS

| 4,171,859 | A | 10/1979 | Altoz et al. |
| 5,101,320 | A | 3/1992 | Bhargava et al. |
| 5,210,680 | A | 5/1993 | Scheibler |
| 5,528,455 | A | 6/1996 | Miles |
| 6,047,836 | A | 4/2000 | Miles |
| 6,058,011 | A * | 5/2000 | Hardt et al. ............. 361/694 |
| 6,181,557 | B1 | 1/2001 | Gatti |
| 6,301,108 | B1 | 10/2001 | Stockbridge |
| 6,342,004 | B1 | 1/2002 | Lattimore et al. |
| 6,542,363 | B2 | 4/2003 | White |
| 6,710,240 | B1 | 3/2004 | Chen et al. |
| 6,771,499 | B2 | 8/2004 | Crippen et al. |
| 7,344,439 | B2 * | 3/2008 | Henry et al. ............. 454/184 |
| 2004/0252456 | A1 | 12/2004 | Larson et al. |
| 2004/0264124 | A1 * | 12/2004 | Patel et al. ............. 361/686 |

FOREIGN PATENT DOCUMENTS

JP    55031271 A  *  3/1980

* cited by examiner

*Primary Examiner*—Steven B McAllister
*Assistant Examiner*—Patrick F. O'Reilly, III
(74) *Attorney, Agent, or Firm*—Cynthia G. Seal; Schubert Osterrieder & Nickelson PLLC (57) ABSTRACT

A system, method, and apparatus for distributing air in a blade server are disclosed. Embodiments may include a rotating damper having a damper door, sliding door, and connecting rod. The damper door may be rotatably attached to a blade server having a plurality of blade slots for receiving blades and may rotate between a blocking position and a flat position, where the damper door impedes air through a blade slot when in the blocking position. The sliding door may move between an open position and a closed position, where the sliding door allows airflow through an air opening while in the open position and blocks airflow through the air opening while in the closed position. A further embodiment may include an extension spring to apply a pulling force to the sliding door and a kick up spring to apply a pushing force to the damper door in the flat position.

6 Claims, 10 Drawing Sheets

FIG. 10

METHODS FOR DISTRIBUTING AIR IN A BLADE SERVER

CROSS-REFERENCES TO RELATED APPLICATIONS

Pursuant to 35 USC §120, this continuation application claims priority to and benefit of U.S. patent application Ser. No. 11/368,578, entitled "SYSTEM, METHOD, AND APPARATUS FOR DISTRIBUTING AIR IN A BLADE SERVER", filed on Mar. 6, 2006, now U.S. Pat. No. 7,344,439 the disclosure of which is incorporated herein in its entirely for all purposes.

FIELD OF INVENTION

The present invention generally relates to the field of computer servers and computer systems, such as a blade server with a chassis and a number of interconnected blades. More particularly, the present invention relates to a system, method, and apparatus for distributing air in a blade server.

BACKGROUND

In today's environment, a server computer system often includes several components, such as the server itself, hard drives, or other peripheral devices. These components are generally stored in racks. For a large organization, the storage racks can number in the hundreds and occupy huge amounts of expensive floor space. Also, because the components are generally free standing components (i.e., they are not integrated), resources such as disk drives, keyboards, and monitors cannot easily be shared. Blade servers have been developed to bundle the server computer system described above into a compact operating unit. A blade server may be a high-density, rack-mounted packaging architecture for servers that provides input/output (I/O), systems management, and power to individual blades. Blades may include servers, processor nodes, storage nodes, or other components and may each plug into and operationally connect to the blade server to share in resources such as power, cooling, network connectivity, management functions, and access to other shared resources (such as a front-panel or CD-ROM drive). One feature of blade servers is that individual blades may be 'hot swapped' without affecting the operation of other blades in the system. An administrator or other user may simply remove one blade (such as one that is inoperable or that will be replaced) and place another in its place. An example blade server is International Business Machines (IBM®) Corporation's IBM eServer™ BladeCenter® system, a high-density, rack-mounted packaging architecture for servers that provides I/O, systems management, and power to inserted blades.

In server design, as in the design of many other types of computer systems, there is a trend towards higher densities of components. For example, it is often desirable to put a greater number of server blades into a package of given size. Additionally, server designers (similarly to designers of other computer systems) continue to increase performance of server components in order to meet customer needs. In combination, the higher component densities and increased performance of components result in an increased need for cooling of the servers and their components. Such increased cooling needs are likely to continue to rise as component densities and performance both increase. Accordingly, blade servers typically cool their component blades by drawing air through the chassis of the blade server and thus through each blade (or fillers) via the use of blowers in a front-to-back blade cooling pattern. Typically, it is desired for approximately equal airflow to flow through each blade so that each receives sufficient airflow for cooling.

As cooling needs continue to increase, current cooling solutions suffer from problems in some situations. When one or more blades are removed from a blade server, for example, the airflow no longer is evenly distributed across the server as the majority of air entering the system will follow the path of least resistance and rush into the wide open slots. When this happens, the slots adjacent to the empty slots will be starved of their required airflow and blade temperature will rise, potentially causing performance degradation, reduction of lifetime, or failure of components. Another problem with current cooling solutions is that cooling air only enters the blades from the front. For some high performance blades, certain components such as hard drives and memory may suffer from inadequate cooling when only traditional front-to-back cooling is offered because of the blade configuration and their particular needs. There is, therefore, a need for an effective and efficient system to distribute air in a blade server system, particularly when one or more blades are removed or more complex cooling air patterns beyond traditional front-to-back flows are required.

SUMMARY OF THE INVENTION

The problems identified above are in large part addressed by a system, method, and apparatus for distributing air in a blade server. Embodiments may include a rotating damper apparatus for a blade server air distribution system having a damper door, a sliding door, and a connecting rod. The damper door may be rotatably attached to a blade server having a plurality of blade slots for receiving a blade and may be adapted to rotate between a first blocking position and a second flat position, where the damper door at least partially impedes air through a blade slot when in the blocking position. The sliding door may move between a first open position and a second closed position where the sliding door allows airflow through an air opening while in the open position and at least partially blocks airflow through the air opening while in the closed position. The connecting rod may connect the damper door and the sliding door and may move the sliding door in response to movement of the damper door and move the damper door in response to movement of the sliding door. A further embodiment may include an extension spring attached to the sliding door to apply a pulling force to the sliding door. Another embodiment may also include a kick up spring to apply a pushing force to the damper door while the damper door is in the flat position.

A further embodiment provides a blade server air distribution system that includes a chassis having a plurality of blade slots each adapted to receive a blade, where the chassis partially encloses a cavity. Embodiments may also include one or more power supplies positioned within the chassis where each power supply has a power supply fan to draw air from outside the chassis. Embodiments may also include one or more blowers positioned within the chassis where each blower draws air from outside the chassis and through the cavity. Embodiments may also include one or more rotating dampers positioned within each blade slot, each rotating damper having a damper door rotatably attached to the chassis and having blocking and flat positions, a sliding door having open and closed positions, and a connecting rod connecting the damper door and the sliding door. The damper doors may impede air through an empty blade slot while in the blocking position and the sliding doors may allow airflow through an air opening from a power supply to an inserted blade while in the open position. Further embodiments may include a plurality of extension springs each attached to a sliding door and a plurality of kick up springs to apply a pushing force to a damper door while the damper door is in the flat position.

Another embodiment provides a method for configuring air distribution within a blade server. Embodiments of the method may include receiving contact from a blade being inserted at a damper door in a blocking position, rotating the damper door towards a flat position, and moving a sliding door to an open position in response to rotation of the damper door, where the sliding door open position allows airflow through an air opening. A further embodiment provides for, in response to pulling the blade from the blade server, rotating the damper door towards the blocking position. The further embodiment may also provide for moving the sliding door to a closed position in response to rotation of the damper door towards the blocking position, where the sliding door closed position substantially blocks airflow through the air opening, and rotating the damper door to the blocking position.

BRIEF DESCRIPTION OF THE DRAWINGS

Advantages of the invention will become apparent upon reading the following detailed description and upon reference to the accompanying drawings in which, like references may indicate similar elements.

DETAILED DESCRIPTION OF EMBODIMENTS

The following is a detailed description of example embodiments of the invention depicted in the accompanying drawings. The example embodiments are in such detail as to clearly communicate the invention. However, the amount of detail offered is not intended to limit the anticipated variations of embodiments; but, on the contrary, the intention is to cover all modifications, equivalents, and alternatives falling within the spirit and scope of the present invention as defined by the appended claims. The detailed descriptions below are designed to make such embodiments obvious to a person of ordinary skill in the art.

A system, method, and apparatus for distributing air in a blade server are disclosed. Embodiments may include a rotating damper apparatus for a blade server air distribution system having a damper door, a sliding door, and a connecting rod. The damper door may be rotatably attached to a blade server having a plurality of blade slots for receiving a blade and may be adapted to rotate between a first blocking position and a second flat position, where the damper door at least partially impedes air through a blade slot when in the blocking position. The sliding door may move between a first open position and a second closed position where the sliding door allows airflow through an air opening while in the open position and at least partially blocks airflow through the air opening while in the closed position. The connecting rod may connect the damper door and the sliding door and may move the sliding door in response to movement of the damper door and move the damper door in response to movement of the sliding door. A further embodiment may include an extension spring attached to the sliding door to apply a pulling force to the sliding door. Another embodiment may also include a kick up spring to apply a pushing force to the damper door while the damper door is in the flat position.

The disclosed apparatus and system may provide for an efficient and effective mechanism for distributing air in a blade server. When a blade is removed from the blade server, the disclosed mechanism rotates the damper door to a blocking position that blocks airflow from entering the recently vacated blade slot. Either one damper door (on the top or bottom and with a length to cover the span of the blade slot) or two damper doors (with each covering approximately half of the blade slot) may be used to block the blade slot. By blocking the blade slot when a blade is removed, the disclosed mechanism advantageously prevents large amounts of air from rushing through the empty blade slot and negatively impacting cooling flow through other blades. When a blade is inserted into the blade server, the disclosed mechanism advantageously slides the sliding door out of the way of an air opening, allowing air to pass into the side of a blade for additional cooling capacity (such as from a power supply). The disclosed mechanism advantageously provides for movement of the damper door and sliding door automatically in response to insertion and removal of a blade from the blade server, allowing for efficient reconfiguring of air distribution in the blade server as blades are removed or added.

Figure 1:
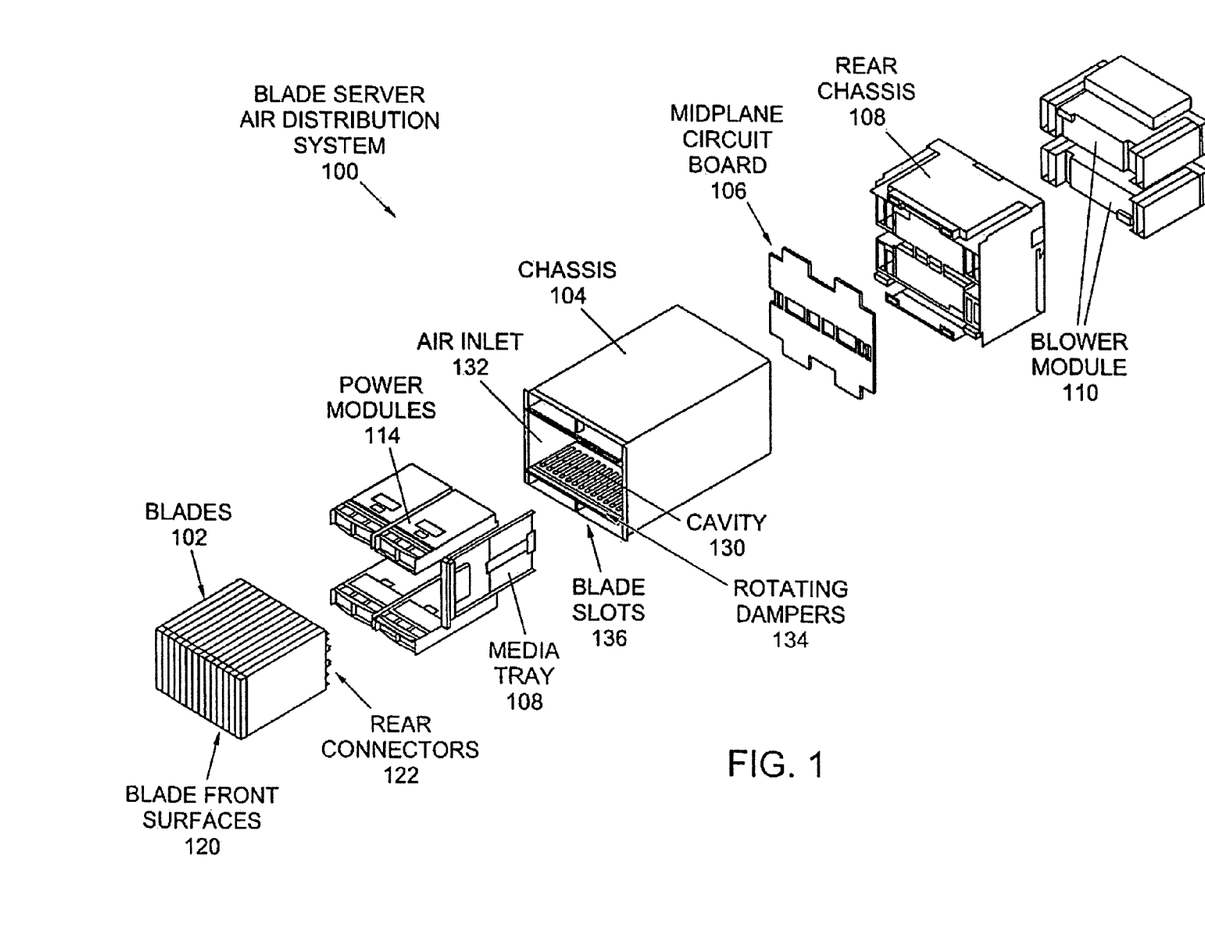
FIG. 1 depicts a front, top, and right side exploded perspective view of a blade server air distribution system with a chassis, blades, and rotating dampers according to one embodiment.

Turning now to the drawings, FIG. 1 depicts a front, top, and right side exploded perspective view of a blade server air distribution system with a chassis, blades, and rotating dampers according to one embodiment. In the depicted embodiment, the blade server air distribution system 100 includes a chassis 104 partially enclosing a cavity 130 with an open front side (air inlet 132) that may receive one or more blades 102 to form a blade server. The chassis 104 may include a plurality of blade slots 136 to receive inserted blades 102. The embodiment of FIG. 1 includes fourteen blades 102 that may be hot-pluggable into the fourteen blade slots 136 in the front of the chassis 104. The blades 102 and modules (except the midplane circuit board) of the blade server air distribution system 100 may be hot-pluggable so that if one fails it may be replaced without shutting down system power. As will be described in more detail subsequently, the blade server air distribution system 100 may also include a plurality of rotating dampers 134 positioned in the blade slots 136 to block airflow when no blade 102 is inserted and to facilitate airflow into the sides of a blade 102 when it is inserted and docked. An example blade server air distribution system 100 may be a modified International Business Machines (IBM) Corporation's IBM eServer™ BladeCenter® system, a high-density, rack-mounted packaging architecture for servers that provides input/output (I/O), systems management, and power to blades 102. One of ordinary skill in the art will recognize, however, that other types of blade server air distribution systems 100 may be utilized within the scope of the invention.

A media tray 108 may also be included within chassis 104. The media tray 108 may include a floppy disk drive and/or CD-ROM drive and may couple to any of the attached blades 102. The media tray 108 may also house an interface board on which is mounted interface light emitting diodes (LEDs), a thermistor for measuring air inlet temperature, and a USB controller hub. Each blade 102 may have a front surface 120 and one or more rear connectors 122. The rear connectors 122 of a blade 102 may operably connect to the chassis 104 by insertion into the midplane circuit board 106 located at the rear of die chassis 104. Blades 102 may interface with other components of the blade server air distribution system 100 via the midplane circuit board 106 via interfaces such as a power interface, communications or network interface (e.g., Ethernet, Fibre Channel), a management module serial link, a VGA analog video link, a keyboard/mouse USB link, a CD-ROM and floppy disk drive USB link, control signal link, or other interface. These interfaces may provide the ability to communicate to other components in the blade server air distribution system 100 such as management modules, switch modules, the CD-ROM, etc. These interfaces may also be duplicated to provide redundancy.

One or more power modules 114 may also be included within chassis 104 in some embodiments. The power modules 114 may provide DC operating voltages for the blades 102 and other components by, for example, converting power from an AC source. As described in more detail subsequently, the power modules 114 may also provide additional cooling to blades 102 by drawing in air and directing part of the air through the blades 102.

The blade server air distribution system 100 may also include a rear chassis 108 that contains a plurality of hot-swappable modules. The rear chassis 108 may attach to the rear of the chassis 104 to form the structure of the blade server air distribution system 100. Hot-swappable modules may include one or more blower modules 110 as well as other types of modules such as switch modules or management modules. Blower modules 110 may include one or more variable-speed blowers to draw air from the front of the blade server air distribution system 100 and exhaust it to the rear in order to cool its components.

Other types of modules may include switch modules and management modules. Switch modules may provide network and/or switch functions to the blades 102. An Inter-Integrated Circuit (I2C) Serial Bus Interface may be used by a management module to configure, monitor and control the switch modules. Switch modules may provide Ethernet connectivity in some embodiments, but may also provide Fibre Channel or other connectivity. Management modules may provide basic management functions such as controlling, monitoring, alerting, restarting, and diagnostics to the blade server air distribution system 100, including the chassis 104, blades 102, modules, and shared resources. Management modules may also provide functionality that allows an external data center management application to be used to help manage the blade server air distribution system 100, The management module may consist of a processor and keyboard, video, and mouse (KVM) switch function and may be operably connected to other modules, the midplane circuit board 106, or other components. Management modules may also work in conjunction with a baseboard management controller (BMC) of a blade 102 to provide management functions.

Blades 102 (which may also be known as server blades or processor blades) may not only perform processor or server functions but may also perform other functions, such as a storage blade that includes hard disk drives and whose primary function is data storage. Blades 102 may provide the processor, memory, hard disk storage and firmware of an industry standard server. In some embodiments, blades 102 may be general- or specific-purpose servers that contain components such as processors, memory, optional local integrated drive electronics (IDE) or Small Computer System Interface (SCSI) disk drives, Ethernet or other network controllers, the BMC, and power conversion circuitry to convert a 12 V DC input to the various voltages required by blade 102 electronics components. In addition, they may include KVM selection via a control panel, an onboard service processor, and access to the floppy and CD-ROM drives in the media tray 108. Each blade 102 may have a control panel with light-emitting diodes (LEDs) to indicate current status plus switches for power on/off, selection of server blade, reset, nonmaskable interrupt reset (NMI) for core dumps, or other functions. A daughter card (not shown) maybe connected to a blade 102 via an onboard bus, connector or other interface to provide additional high-speed links to the switch modules.

Blades 102 may be hot-swapped without affecting the operation of other blades 102 in the blade server air distribution system 100. A blade 102 may typically be implemented as a single slot card but may, in some cases, require two or more slots. A blade 102 may use any microprocessor technology (i.e., be from any microprocessor family) as long as it is compliant with the mechanical and electrical interfaces (and is desirably consistent with the power and cooling requirements of the blade server air distribution system 100). Blades 102 may also contain a baseboard management controller (BMC) (not shown) to work in conjunction with the management module to manage the blade 102. BMCs (which may also be known as local service processors) may support blade server air distribution system 100 functions, such as communication with the management modules, with the Control panels and LEDs, with the control panel buttons for power on/off, etc., and with inventory, error reporting, and environmental monitoring and reporting. The BMCs may also support other functions such as serial over LAN (SOL) and wake on LAN (WOL).

Blades 102 may include server or processor blades as well as expansion blades. An expansion blade 102, also known as a 'sidecar', can be added to a base, or parent, blade 102 to expand its functionality by connecting the expansion blade 102 to bus, connector, or other interface bus of the parent. Sidecars may include blade storage expansion (BSE) units with hard drives, a PCI I/O expansion unit that can support a variety of PCI adapters, special function add-ons (e.g., a daughter card or a specialized processing unit), an expansion unit that may support additional I/O daughter cards, or any other expansion blade known now or later developed. Sidecars may also be an actual blade 102 in some embodiments. Sidecars may be stacked in layers (i.e., sidecar attached to sidecar attached to parent blade 102) and may be attached to any external surface of the blade 102 besides the front or rear. Other types of blades 102 may also be used, whether now in use or later developed, as one of ordinary skill in the art will recognize. Blades 102 may be physically connected, or attached, either when physically external or internal to the chassis 104. For example, a sidecar may mate with an already installed blade 102 by being inserted next to blade 102 until clicking into place. The same sidecar may have a release mechanism that may be depressed so that an operator may remove the sidecar from the chassis 104 without removing the blade 102 to which it was connected.

Cooling of blades 102 may be accomplished by the blower modules 110 drawing air from the front of the blade server air distribution system 100 through air inlet 132 and exhausting the air to the rear so that the air passes through and cools the blades 102. The blade server air distribution system 100 of the disclosed embodiments also provides for side cooling of the blades 102 from power modules 114 via air openings (not shown in FIG. 1), as will be described in more detail subsequently. The air openings are exposed when a blade 102 is inserted into the chassis 104 and two rotating dampers 134 (or one double-size rotating damper 134) in the blade slot 136 are pushed flat. When a blade 102 is removed, the rotating damper(s) 134 rotates back into a blocking position to impede airflow through the now empty blade slot 136. By impeding the airflow in an empty blade slot 136, the disclosed rotating dampers 134 assist in maintaining equalized airflow and cooling across each blade 102 and blade slot 136. Without the impeding effect of the rotating dampers 134, airflow may rush through any open blade slots 136 and thus starve the airflow to the docked blades 102. The disclosed systems accordingly may provide an efficient and effective methodology for distributing air in a blade server system.

Figure 2:
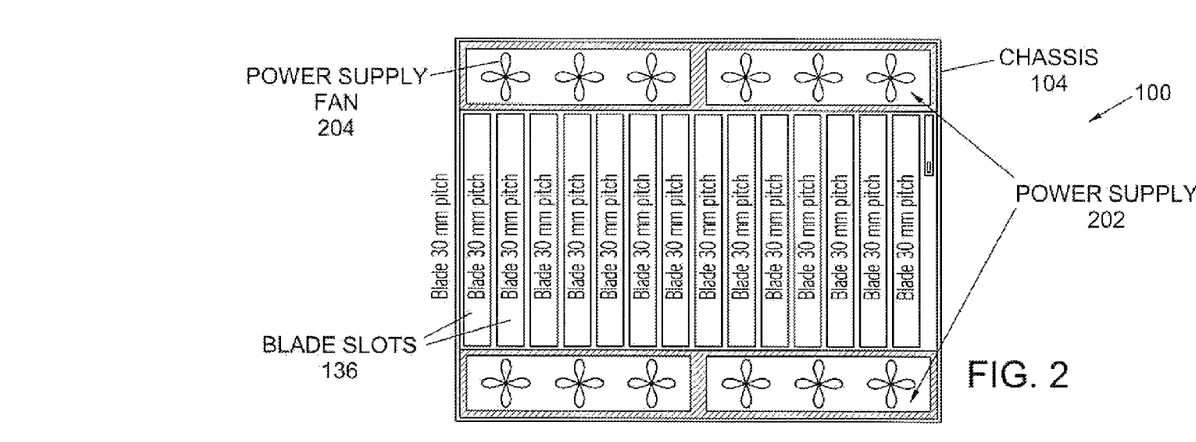
FIG. 2 depicts a front view of a blade server air distribution system with multiple blade slots and power supplies according to one embodiment.
Figure 3:
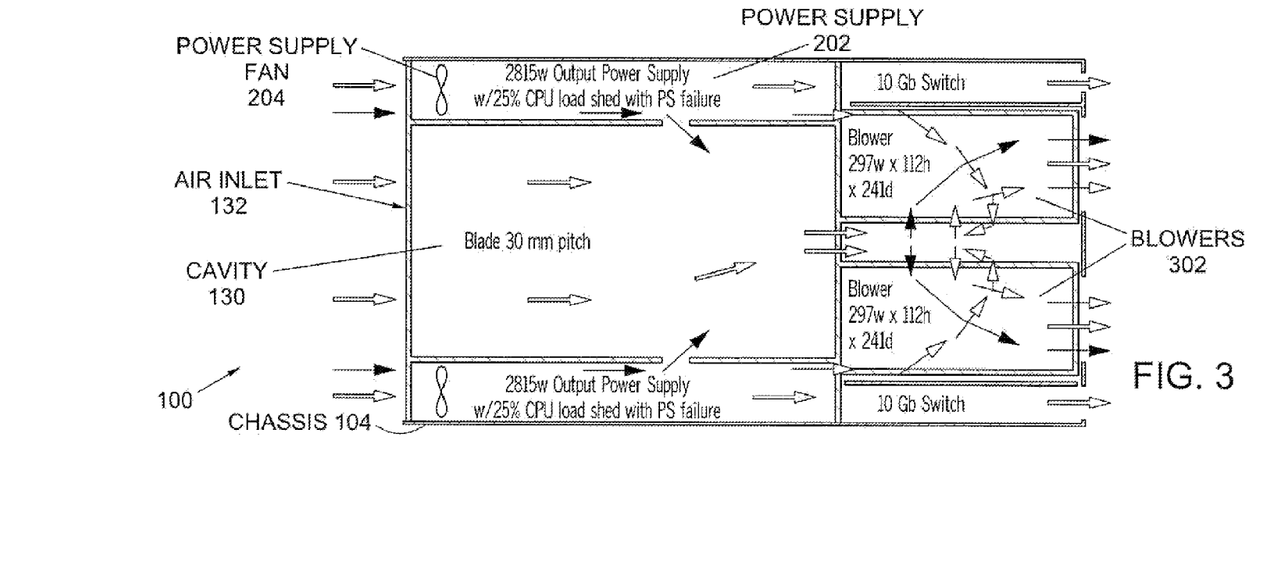
FIG. 3 depicts a side cut-away view of the blade server air distribution system of FIG. 2 according to one embodiment.

FIGS. 2 and 3 depict a blade server air distribution system 100 with one or more power supplies with individualized cooling according to some embodiments. FIG. 2 depicts a front view of a blade server air distribution system 100 with multiple blade slots and power supplies according to one embodiment. As described previously, the blade server air distribution system 100 includes a chassis 104 that includes a plurality of blade slots 136 for receiving blades 102. The disclosed blade server air distribution system 100 also includes one or more power supplies 202 positioned above and below (in the view of FIG. 2) the blade slots 136. A power module 114 may include one or more power supplies 202 and the terms may be used interchangeably herein for most purposes. Each power supply 202 may draw air into its interior through its front surface for cooling specific for each power supply 202. Each power supply 202 (which may be part of a power module 114 or be a power module 114) may include a fan pack that includes one or more power supply fans 204 to draw in cooling air into the power supplies 202. In the depicted embodiment, each power supply 202 contains three power supply fans 204 for redundancy in the event of power supply fan 204 failure.

FIG. 3 depicts a side cut-away view of the blade server air distribution system 100 of FIG. 2 according to one embodiment. The embodiment of FIG. 3 depicts the airflow for cooling the blade server air distribution system 100. Each power supply 202 includes a power supply fan 204 positioned near the front, or air inlet 132 side, of the chassis 104. As described previously, the power supply fans 204 may pull air in from outside the chassis and through the power supply 202 for cooling of each power supply 202. After partially passing through the power supply 202, part of the airflow may be directed through an air inlet (not shown) into the side of an inserted blade 102 for additional cooling of blade 102 components, as depicted by the arrows in FIG. 3 entering the cavity 130 from each power supply 202. For the main part of the airflow through the cavity 130 and blades 102, blowers 302 (within the blower modules 110 of FIG. 1) pull air front outside the chassis 104 through the air inlet 132, and then through the blades 102 towards and through the rear of the chassis 104. In some embodiments, approximately 80 percent of blade cooling may be provided by front-to-back blower 302 cooling and approximately 20 percent of blade cooling may be provided by side inlet power supply 202 air, though the ratios will vary depending on the configuration and design of the blade server air distribution system 100. As will be described in more detail subsequently, the rotating dampers 134 facilitate passage of air from the power supplies 202 into the sides of the blades 102 when blades are inserted and the rotating dampers 134 also facilitate blockage of air in an empty blade slot 136 when a blade 102 is removed for even distribution of airflow across the blades 102.

Figures 4A, 4B, 4C:
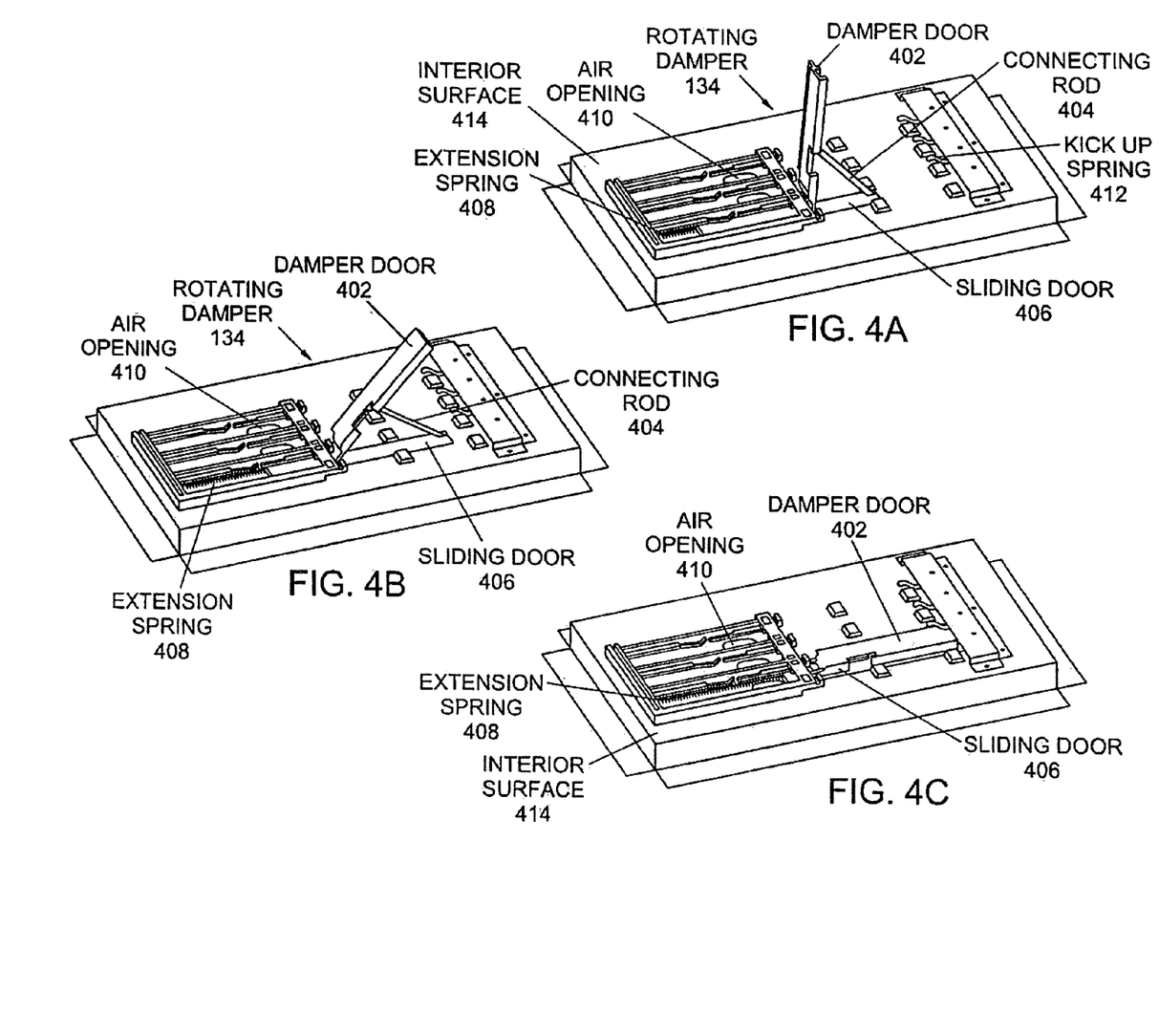
FIG. 4A depicts a front, top, and right side cut-away perspective view of a rotating damper of a blade server air distribution system in an extended position to one embodiment.
FIG. 4B depicts a front, top, and right side cut-away perspective view of the rotating damper of FIG. 4B in an intermediary position to one embodiment.
FIG. 4C depicts a front, top, and right side cut-away perspective view of the rotating damper of FIG. 4B in a retracted position to one embodiment.

FIGS. 4A-4C depict a rotating damper of the disclosed embodiments transitioning between a retracted and extended position. FIG. 4A depicts a front, top, and right side cut-away perspective view of a rotating damper 134 of a blade server air distribution system in an extended position according to one embodiment. The extended position may represent the state of the rotating damper 134 when no blade 102 is inserted in me blade slot 136. In the depicted embodiment, the rotating damper 134 includes a damper door 402, a sliding door 406, and a connecting rod 404 connecting the damper door 402 and sliding door 406. The damper door 402 may be rotatably attached to an interior surface 414 of the chassis 104. In the depicted embodiment of FIG. 4A, the damper door 402 is in a blocking position where it is positioned to block or otherwise impede air from entering the chassis 104. The sliding door 406 may be mounted parallel to the interior surface 414 and be able to move back and forth parallel to the interior surface 414. In the embodiment of FIG. 4A, the sliding door 406 is in a closed position where it substantially blocks air from flowing through an air opening 410 (not shown, but other exposed air openings 410 are depicted). An extension spring 408 may be attached to the sliding door 406 and the interior surface 414. A kick up spring 412 may also be located on the interior surface 414 (or, alternatively, on a backside of the damper door 402) as will be described in relation to FIG. 4C. In the extended position of the rotating damper 134, the damper door 402 is thus in the blocking position (blocking airflow into the chassis 104 and minimizing inconsistent cooling for other blades 102) and the sliding door is in the closed position (blocking airflow through the air opening 410, which is unnecessary with no blade 102 inserted).

FIG. 4B depicts a front, top, and right side cut-away perspective view of the rotating damper 134 of FIG. 4B in an intermediary position according to one embodiment. The disclosed intermediary position may occur after the damper door 402 has been impacted by the partial insertion of a blade 102 into the chassis 104. As the blade 102 continues to push against the damper door 402 during insertion, the damper door 402 rotates downward towards a flat position (as depicted in FIG. 4C). The downward rotation of the damper door 402 pushes the connecting rod 404 which, in turn, applies a pushing force to the sliding door 406. The pushing force applied to the sliding door moves the sliding door from the closed position of FIG. 4A to the open position of FIG. 4C. FIG. 4B depicts an intermediary position of the sliding door 406 that still leaves the air opening 410 covered. The movement of the sliding door 406 towards the open position pulls on the extension spring 408 and builds up tension in the extension spring 408 that will be used to reverse the motion.

FIG. 4C depicts a front, top, and right side cut-away perspective view of the rotating damper 134 of FIG. 4B in a retracted position according to one embodiment. The retracted position is the position the rotating damper 134 will be in after a blade 102 is completely inserted. In the retracted position, the damper door 402 lies approximately parallel to the interior surface 414 in a flat position. In the flat position, the damper door 402 may rest on and compress the kick up spring 412. The movement of the damper door 402 to the flat position pulls the sliding door 406 enough to uncover the air opening 410 (the open position) and may result in the sliding door 406 being positioned at least partially under the damper door 402. In this retracted position of the rotating damper 134, the damper door 402 is thus in a flat position (allowing for complete insertion of the blade 102 in the blade slot 136) and the sliding door 406 is in an open position (allowing for flow through the air opening 410) so that cooling air may pass from a power supply 202 to the side of a blade 102. In this position, the blade 102 (not shown) will be positioned over the damper door 402 and may restrain the damper door 402 from leaving its flat position.

While FIGS. 4A-4C depict a movement of the rotating damper 134 from an extended position to a retracted position as a blade 102 is inserted, the rotating damper 134 may reverse this movement as a blade 102 is removed from its blade slot 136. As the blade 102 (not shown) is retracted (passing from right to left on FIG. 4C), it will eventually be retracted sufficiently to allow the damper door 402 to rotate upwards. Once the blade 102 is no longer restraining the damper door 402, the damper door 402 may begin to rotate upwards from the flat position towards the blocking position. The force to begin and continue the rotation of the damper door 402 may arise from a pulling force of the extension spring 408 on the sliding door 406. The extension spring 40S may pull on the sliding door 406 which, in turn, pushes the connecting rod 404 and effectively pushes the damper door 402 and rotates it back towards the blocking position. The extension spring 408 may apply the necessary force to cause rotation of the damper door 402 throughout its motion from the flat position to the blocking position. The extension spring 408 may be any type of spring that imparts a resistive, or pulling, force when it is extended. Extension springs may be springs that are attached at both ends to other components and provide a return force to components that move apart (i.e., are resistant to a pulling force).

In some embodiments, the extension spring 408 may have difficulty initiating motion of the damper door 402 as the flat position of the damper door 402 and connection rod 404 potentially require a very high force to pull the mechanism. The optional kick up spring 412 (which was compressed during blade insertion 102) may provide an initial 'kick' to the damper door 402 to begin its rotation until the extension spring 408 can provide sufficient force to complete the rotation. The kick up spring 412 may be any type of compression spring that imparts a resistive, or pushing, force as it is compressed. In one embodiment (described in relation to FIG. 10), kick up spring 412 may be a leaf spring. One of ordinary skill in the art will recognize that other types of compression springs may be used as kick up springs 412. A compression spring may be, for example, an open-coil helical spring wound or constructed to oppose compression along the axis of wind, and may include straight springs, hourglass or concave springs, conical and barrel (convex) springs. The kick up spring 412 may be located on the interior surface 414 and/of the damper door 402 itself. In some embodiments, the kick up spring 412 may push the damper door 402 up through an angle of approximately 15-20 degrees from horizontal before disengagement of the kick up spring 412, By pushing the damper door 402 through the initial part of the rotation, the force necessary to return the damper door 402 through the remaining of the 90 degrees to the blocking position may be significantly lessened, One skilled in the art will recognize that different combinations of kick up springs 412, extension springs 408, or other pushing or pulling devices may be utilized to move the rotating damper. For example, a kick up spring 412 would not be necessary if the extension spring 408 had sufficient strength to perform the initial rotation of the rotating damper 134. Similarly, a more powerful and/or extended kick up spring 412 could eliminate the need for an extension spring 408 in some embodiments. Additionally, other types of technology may alternatively be used, such as a burst of compressed air that replaces the kick up spring 412. A combination of an extension spring 408 and kick up spring 412, however, is likely to be able to provide a desirable price/performance/weight package.

Figure 5:
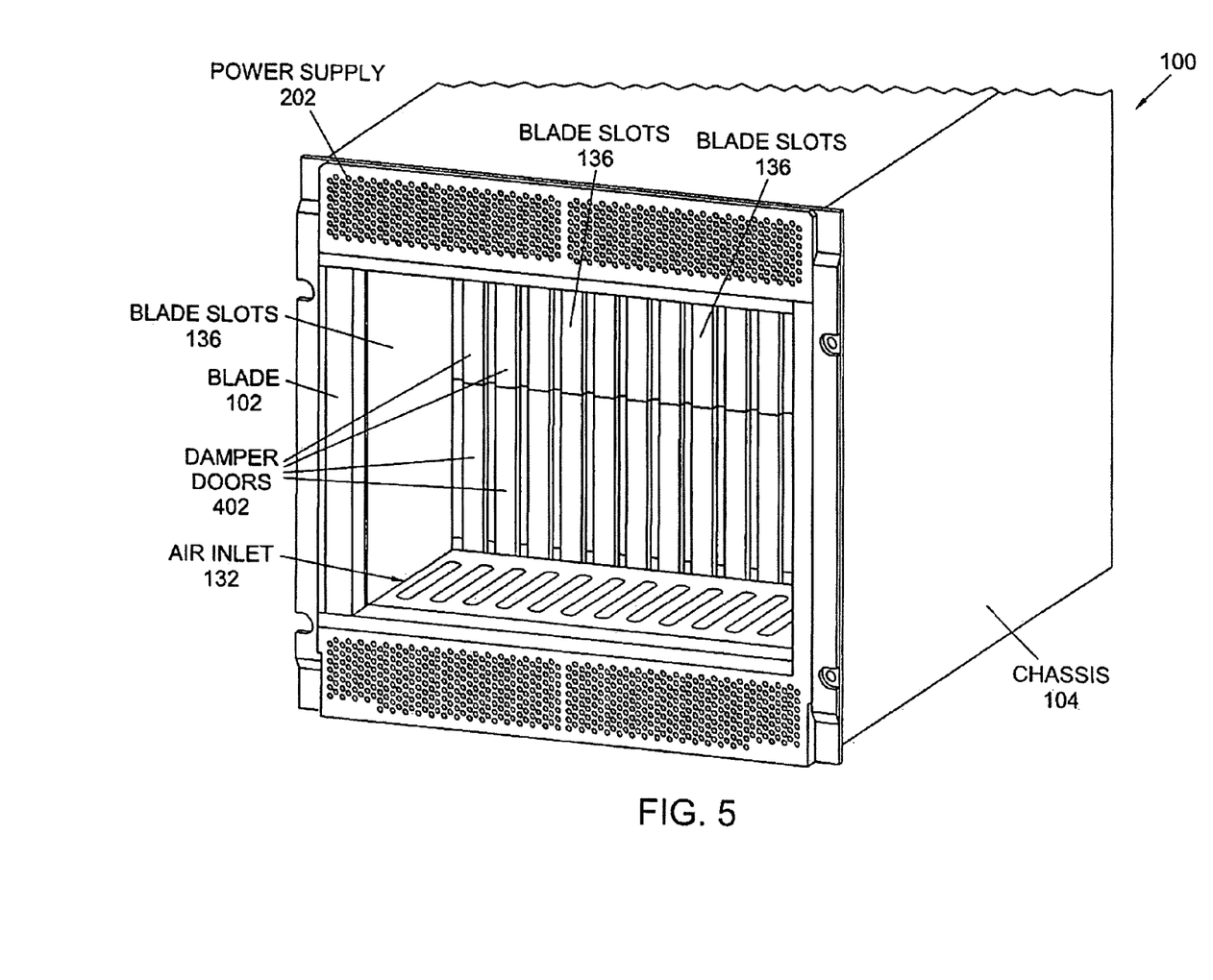
FIG. 5 depicts a front, top, and right side perspective view of a blade server air distribution system with both empty and tilled blade slots according to one embodiment.

FIG. 5 depicts a front, top, and right side perspective view of a blade server air distribution system 100 with both empty and filled blade slots 136 according to one embodiment. As described previously, the blade server air distribution system 100 includes a chassis 104 with an open front side (air inlet 132) that may receive one or more blades 102 in blade slots 136 to form a blade server. In the depicted embodiment, one blade 102 is inserted into the left-most blade slot 136 and the remaining blade slots 136 remain empty. Each empty blade slot 136 of the depicted embodiment has two damper doors 402 in a blocking position so as to impede the flow of air through those blade slots 136. The inserted blade 102 accordingly receives a significant flow of cooling air as the airflow is not diverted through empty blade slots 136 (in addition to power supply cooling air in the side of the blade 102 from the power supplies 202). Without the damper doors 402 of the rotating dampers 134 of the disclosed embodiments, docked blades 102 may be starved of their required airflow because of missing blades 102. While FIG. 5 depicts only one docked blade 102, one of ordinary skill in the art will recognize that any combination of docked blades 102 and blocking damper doors 402 may be utilized.

The blade server air distribution system 100 of FIG. 5 depicts a pair of damper doors 402 in each blade slot 136. One damper door 402 of the pair may rotate upwards from the lower part of the chassis 104 while the other damper door 402 of the pair may rotate downwards from the upper part of the chassis 104. In one embodiment, each damper door 402 is the same size and each occupy approximately half of the blade slot 136, but the damper doors 402 may be sized differently in some embodiments to accommodate different designs, blade 102 configurations, etc. In an alternative embodiment, only one damper door 402 may be used per blade slot 136, rotating from either the upper or lower part of the chassis 104. While this embodiment may have an advantage of having fewer moving parts, it suffers from the disadvantage of only providing power supply cooling air access to one side of the blade 102 instead of the two sides of power supply cooling air provided by the two damper door 402 embodiment.

Figure 6:
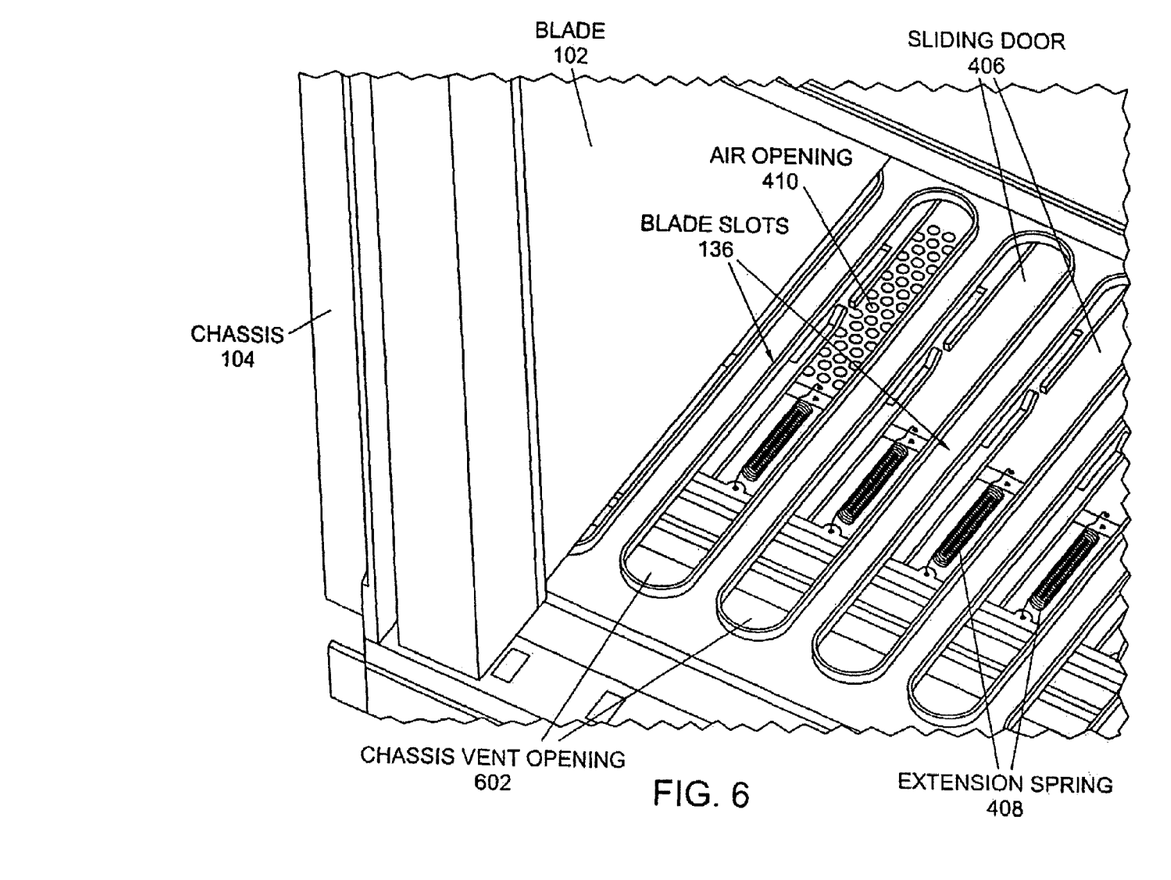
FIG. 6 depicts an enlarged cut-away perspective view of the blade server air distribution system of FIG. 5 according to one embodiment.

FIG. 6 depicts an enlarged cut-away perspective view of the blade server air distribution system 100 of FIG. 5 according to one embodiment. In the interest of brevity, the description of FIG. 5 will not be repeated. In the blade server air distribution system 100 of FIG. 6, chassis vent openings 602 in different states may be seen. A chassis vent opening may be an opening in the chassis 104 between the blade 102 and the power supply 202, such as an opening cut in the inner surface of the chassis 104. In the left-most chassis vent opening 602 of FIG. 6, the sliding door 406 has been moved to the open position, exposing the air opening 410. The configuration of this chassis vent opening 602 would not occur during normal operation without a blade 102 being docked in the blade slot 136 and the configuration is shown for the purpose of clarity. This configuration would be, for example, the configuration beneath the docked blade 102 of FIG. 6. As described previously, when the sliding door 406 is in the open position cooling air may pass from a power supply 202 into the side of the blade 102 for additional cooling.

The other chassis vent openings 602 of FIG. 6 depict sliding doors 406 in the closed position and blocking the air openings 410 beneath them (not shown). This configuration represents the typical operation and configuration when no blade 102 is positioned in a blade slot 136. The air opening 410 in this configuration is blocked so that cooling air from the power supply 202 is not wasted in an air opening 410 without a blade 102.

Figure 7:
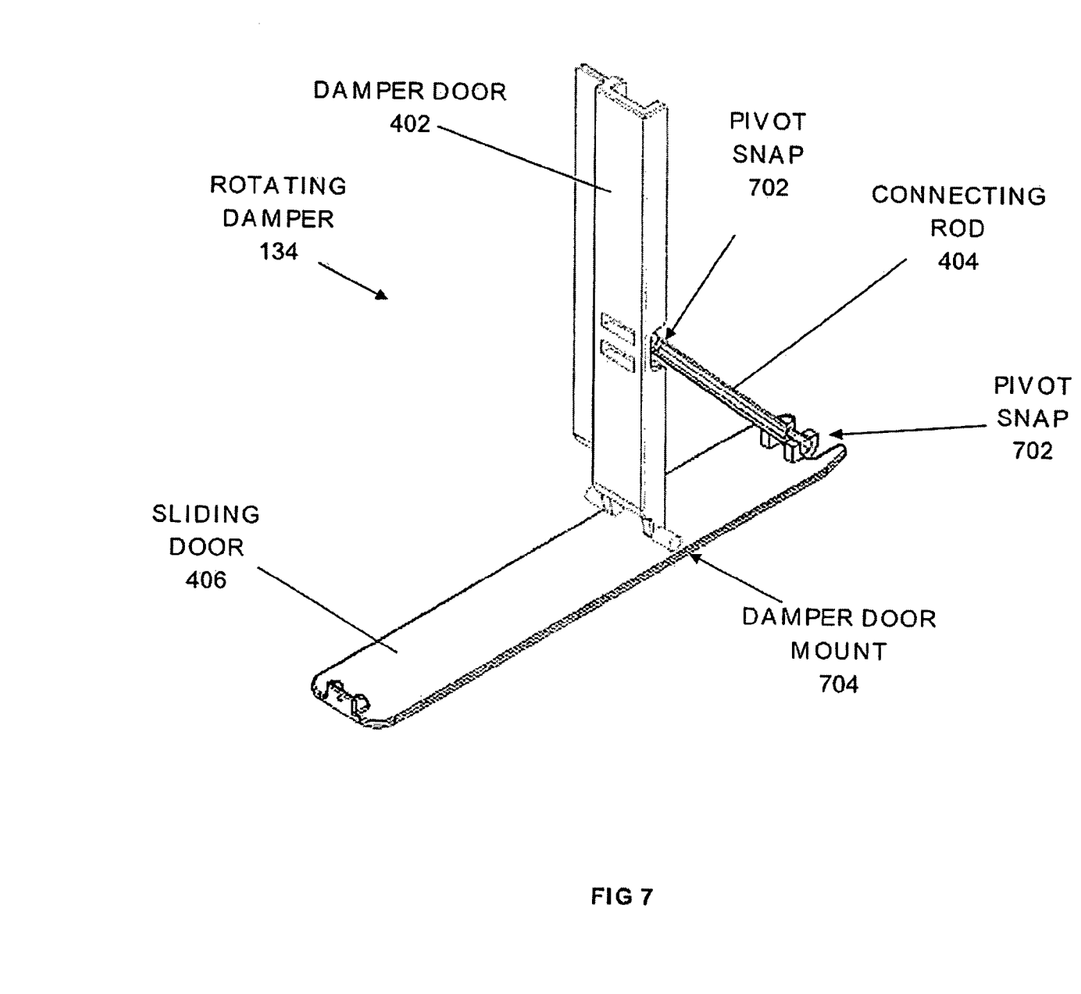
FIG. 7 depicts a front, top, and right side perspective view of a rotating damper before installation according to one embodiment.

FIG. 7 depicts a front, top, and right side perspective view of a rotating damper 134 before installation according to one embodiment. The rotating damper 134 of FIG. 7 is depicted in the extended position with a damper door 402 in a blocking position. The damper door 402 may be attached to the chassis 104 (not shown) via a damper door mount 704, which may be any mount or attachment that allows rotation in at least one axis, providing for a rotatable attachment of the damper door 402 to the chassis 104. The damper door mount 704 may be attached to the chassis 104 either directly or indirectly (through another component) or may be an integrated part of the chassis 104 or other part.

The connecting rod 404 may be connected to each of the damper door 402 and the sliding door 406 via a rotation connection such as a pivot snap 702. Other connections that provide sufficient rotation capability (up to approximately 90 degrees of rotation) may also be used. In some embodiments, the connecting rod 404 may connect to the damper door 402 approximately near the center of the damper door 402, but the optimal and acceptable locations for the connection may vary based on the design. In some embodiments, the connection rod 404 may connect to the sliding door 406 at or near the end of the sliding door 406 that is furthest from the part of the sliding door 406 that will cover the air openings 410. Movement of the sliding door 406 imparts a force to the connecting rod 404 which, in turn, imparts a force to the damper door 402, and vice versa, providing for coupled motion of the damper door 402 and sliding door 406.

Figure 8:
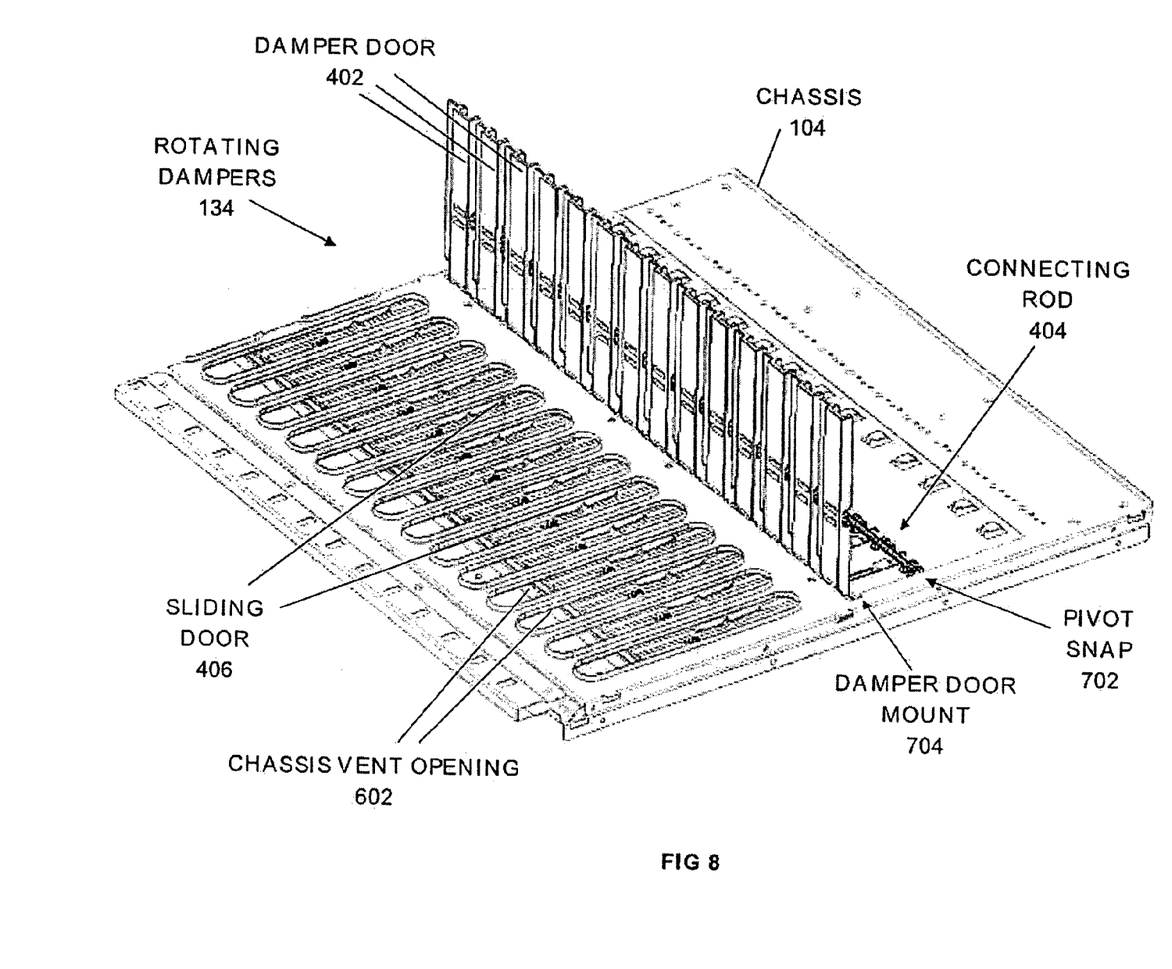
FIG. 8 depicts a front, top, and right side perspective cut-away view of a plurality of installed rotating dampers directly attached to the chassis according to one embodiment.

FIG. 8 depicts a front, top, and right side perspective cut-away view of a plurality of installed rotating dampers 134 directly attached to the chassis 104 according to one embodiment. In the interest of brevity, the description of FIGS. 1-7 will not be repeated here. In FIG. 8, a plurality of rotating dampers 134 are installed in a chassis 104 by means of a damper door mount 704 rotatably attaching each damper door 402 to the chassis 104 directly. The rotating dampers 134 of FIG. 8 are depicted in the extended position with the damper doors 402 in a vertical position that is substantially perpendicular to the inner surface of the chassis 104.

Figure 9:
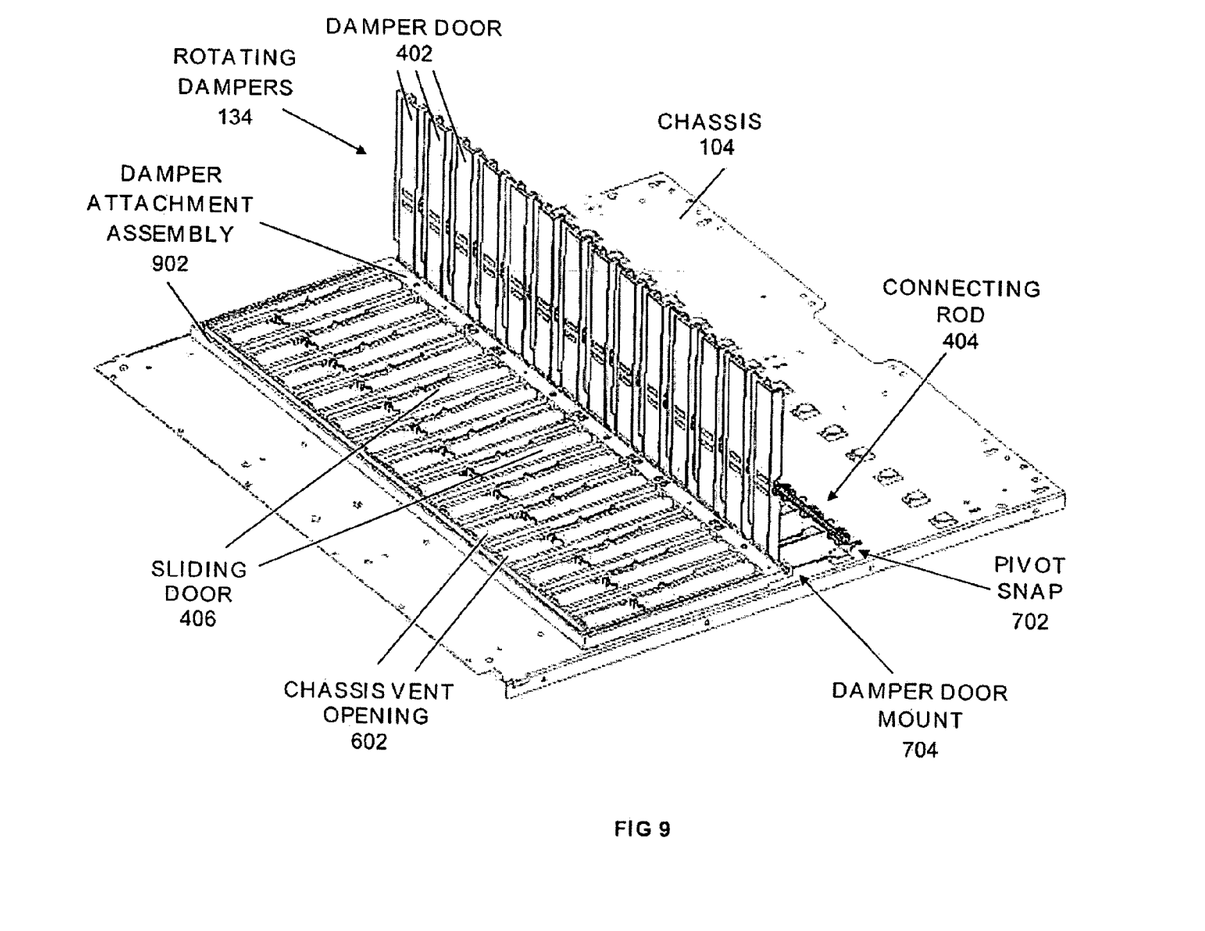
FIG. 9 depicts a front, top, and right side perspective cut-away view of a plurality of installed rotating dampers attached to a damper attachment assembly according to one embodiment.

FIG. 9 depicts a front, top, and right side perspective cut-away view of a plurality of installed rotating dampers 134 attached to a damper attachment assembly according to one embodiment. In the interest of brevity, the description of FIGS. 1-8 will not be repeated here. In FIG. 9, a plurality of rotating dampers 134 are installed in a chassis 104 by means of a damper door mount 704 rotatably attaching each damper door 402 to the damper attachment assembly 902. The damper attachment assembly 902, in turn, may be attached to the chassis 104, providing an indirect attachment of each damper door 402 to the chassis 104. The damper attachment assembly 902 may prove useful, for example, in simplifying installation by providing rotating dampers 134 integrated with the damper attachment assembly 902, eliminating the need to install each rotating damper 134 individually. The damper attachment assembly 902 may have cut-outs to provide access to chassis vent openings 602.

Figure 10:
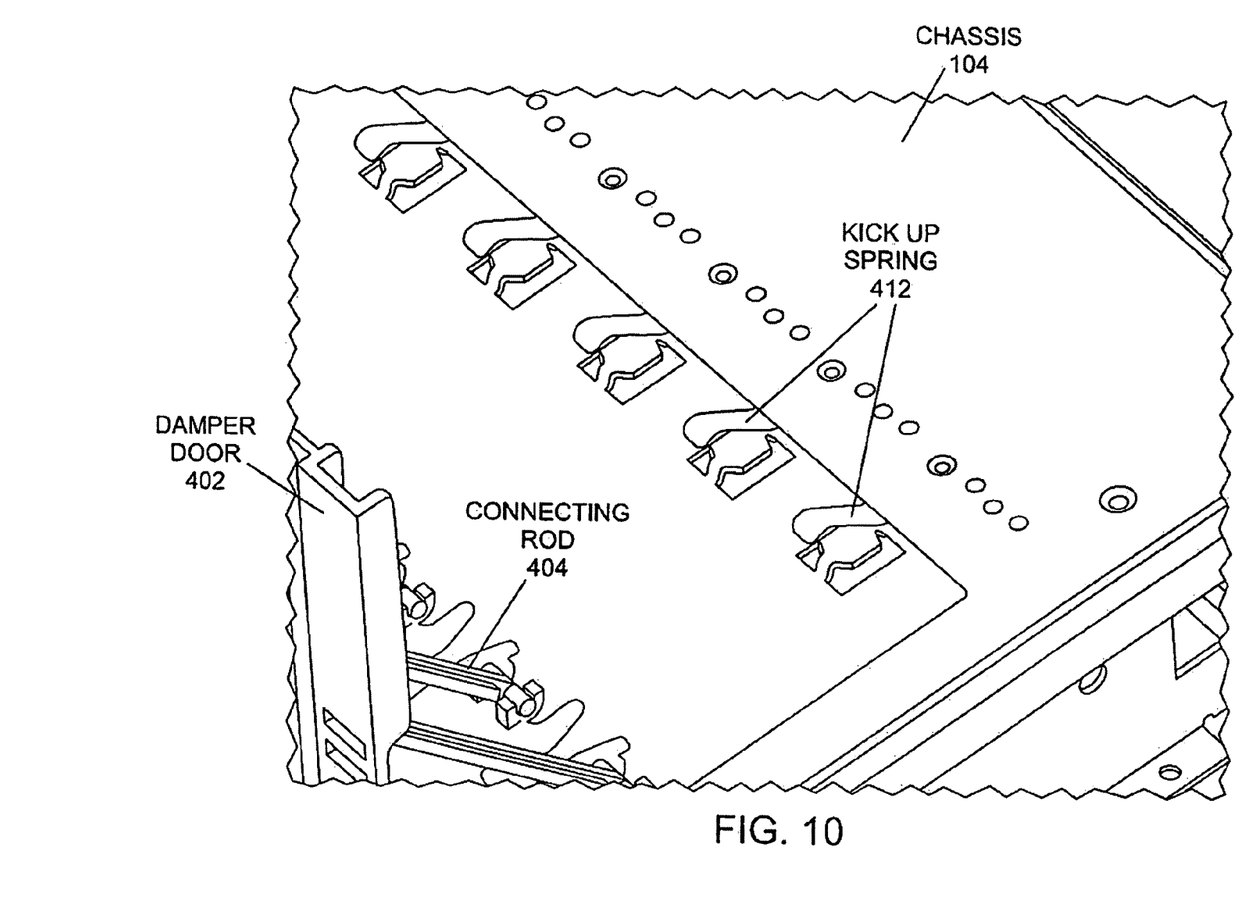
FIG. 10 depicts a front, top, and right side perspective cut-away view of leaf springs being used as kick up springs according to one embodiment.

FIG. 10 depicts a front, top, and right side perspective cut-away view of leaf springs being used as kick up springs according to one embodiment. In the depicted embodiment, each kick up spring 412 is a leaf spring that bends in response to a damper door 402 pushing down on it, storing energy that may be released by pushing up on the damper door 402 as it moves away from the kick up spring 412 during retraction of a blade 102. The design of the leaf spring limits the distance it pushes on the damper door 402 during its rotation. The leaf springs may be attached directly to the chassis 104 in some embodiments (as depicted in FIG. 10), but may also be alternatively attached to the back side of a damper door 402, to a damper attachment assembly 902, etc.

Figure 11:
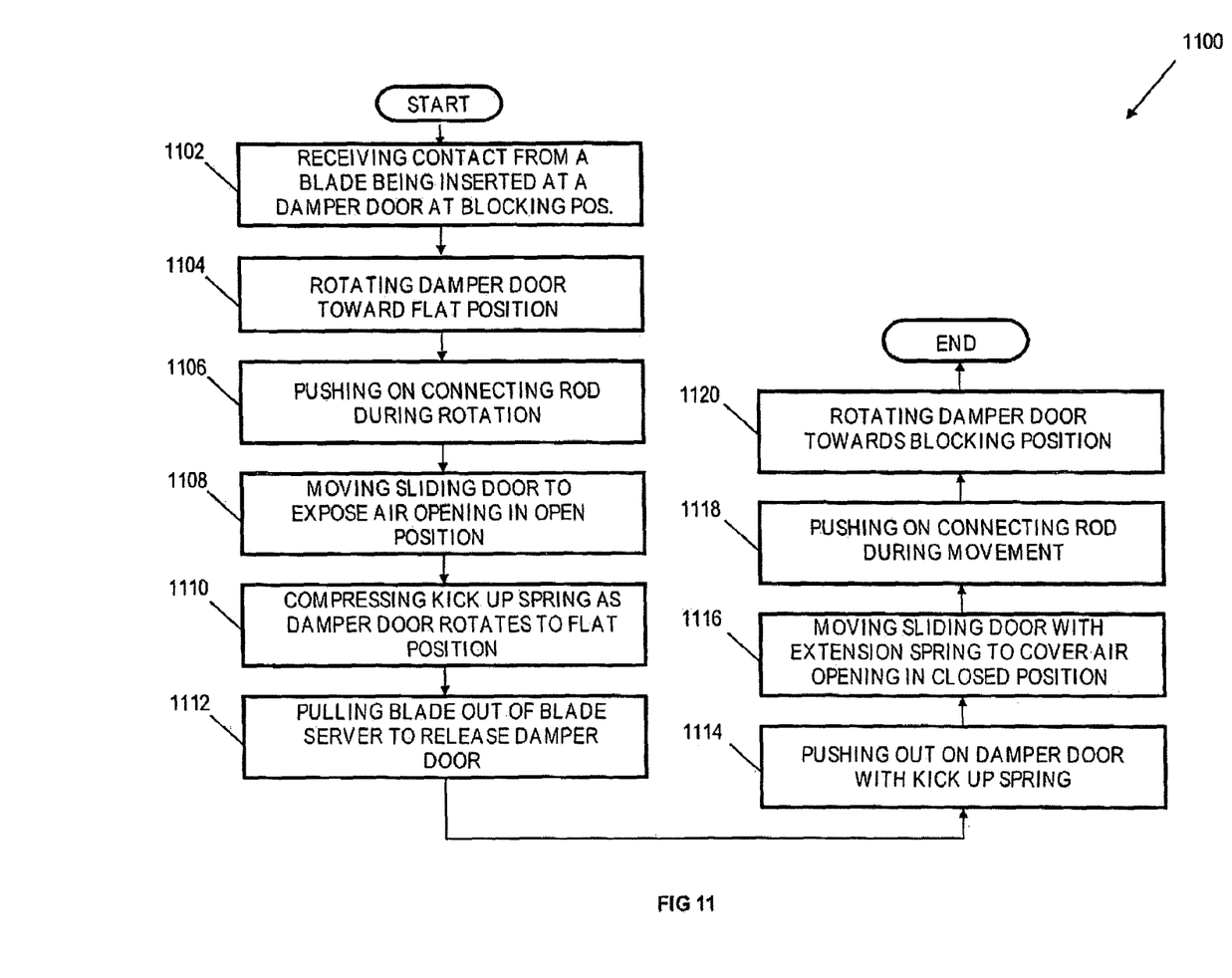
FIG. 11 depicts an example of a flow chart depicting configuring the airflow of a blade server air distribution system according to one embodiment.

FIG. 11 depicts an example of a flow chart depicting configuring the airflow of a blade server air distribution system 100 according to one embodiment. Components or combinations of components of the blade server air distribution system 100 may perform the elements of flow chart 1100 in response to insertion and/or removal of a blade 102 by a user in one embodiment. Flow chart 1100 begins with element 1102, where the damper door 402 may receive contact from a blade 102 being inserted into the cavity 130 of the chassis 104. The damper door 402 may begin flow chart 1100 in the blocking position when the blade 102 first contacts it. As the blade 102 continues to be inserted, the damper door 402 may rotate towards its flat position at element 1104. As the damper door 402 rotates downward, it applies a force to and pushes the connecting rod 404 at element 1106. The connecting rod 404, in turn, pushes the sliding door 406 towards its open position to expose the air opening 410 at element 1108. As the damper door 402 is rotating to its flat position, the damper door 402 may compress a kick up spring 412 at element 1110. Once the blade 102 is fully inserted and docked, the damper door 402 will be in the flat position and the sliding door 406 will be in the open position.

Removal of the blade 102 from the blade server may also be accomplished according to flow chart 1100. At element 1112, a user may pull the blade 102 positioned over a damper door 402 out of the chassis 104 until the damper door 402 is 'released' and fails to have the blade 102 blocking its movement. At optional element 1114, the kick up spring 412 may provide an initial force to begin rotation of the damper door 402 towards its blocking position. The extension spring 408 may at element 1116, in conjunction with the kick up spring 412 in the initial stages, move the sliding door 406 towards its closed position so that it covers the air opening 410. The extension spring 408 may provide a force on the sliding door 406 throughout its movement while the kick up spring 412, if used, generally only imparts a force during the initial rotation of the damper door 402 to assist the operation of the extension spring 408 when it has the least effect (i.e., when the damper door 402 is closest and roughly parallel to the sliding door 406). As described previously, the movement of the sliding door 406 towards its closed position imparts a force on the connecting rod 404 at element 1118. The connecting rod 404 then imparts a force to the damper door 402, rotating the damper door 402 back towards its blocking position at element 1120, after which the method of flow chart 1100 terminates. Once the blade 102 has been removed completely and the damper door 402 returned to its blocking position, the rotating damper 134 will be in the same position that it began flow chart 1100.

It will be apparent to those skilled in the art having the benefit of this disclosure that the present invention contemplates a system, method, and apparatus for distributing air in a blade server. It is understood that the form of the invention shown and described in the detailed description and the drawings are to be taken merely as examples. It is intended that the following claims be interpreted broadly to embrace all the variations of the example embodiments disclosed.

While certain operations have been described herein relative to a direction such as "above" or "below" it will be understood that the descriptors are relative and that they may be reversed or otherwise changed if the relevant structure(s) were inverted or moved. Therefore, these terms are not intended to be limiting.

Although the present invention and some of its advantages have been described in detail for some embodiments, it should be understood that various changes, substitutions and alterations can be made herein without departing from the spirit and scope of the invention as defined by the appended claims. Although an embodiment of the invention may achieve multiple objectives, not every embodiment falling within the scope of the attached claims will achieve every objective. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for configuring air distribution within a blade server, the method comprising:
    receiving contact from a blade at a damper door in a blocking position from the blade being inserted into a blade server;
    rotating the damper door towards a flat position as the blade continues to be inserted into the blade server;
    applying a force to a connecting rod by the damper door as it rotates towards the flat position; and
    moving a sliding door to an open position by the connecting rod in response to rotation of the damper door and the resulting force on the connecting rod, the sliding door open position allowing airflow through an air opening.

2. The method of claim 1, further comprising compressing a kick up spring during rotation of the damper door towards the flat position.

3. The method of claim 1, further comprising rotating the damper door to the flat position.

4. The method of claim 1, further comprising: in response to the blade being removed from the blade server, rotating the damper door towards the blocking position;
    moving the sliding door to a closed position in response to rotation of the damper door towards the blocking position, the sliding door closed position substantially blocking airflow through the air opening; and
    rotating the damper door to the blocking position.

5. The method of claim 4, further comprising pushing out on the damper door to rotate the damper door towards the blocking position.

6. The method of claim 1, wherein rotating the damper door towards the flat position comprises pushing on a connecting rod during rotation.

\* \* \* \* \*